United States Patent [19]

Tregilgas et al.

[11] Patent Number: 4,684,415
[45] Date of Patent: Aug. 4, 1987

[54] CORE ANNIHILATION METHOD OF $Hg_{1-x}Cd_xTe$

[75] Inventors: John H. Tregilgas, Richardson; Thomas L. Polgreen, Dallas, both of Tex.

[73] Assignee: Texas Instruments Incorporated, Dallas, Tex.

[21] Appl. No.: 789,231

[22] Filed: Oct. 18, 1985

[51] Int. Cl.⁴ .......................................... H01L 21/388
[52] U.S. Cl. .................................. 437/228; 148/20.3; 148/20.6; 420/523
[58] Field of Search ...................... 148/1.5, 20.3, 171, 148/20.6, 186; 420/523–526; 29/572

[56] References Cited

U.S. PATENT DOCUMENTS

| | | | |
|---|---|---|---|
| 3,670,220 | 6/1972 | Kun et al. ........................ | 148/188 X |
| 3,723,190 | 3/1973 | Kruse et al. ......................... | 148/1.5 |
| 3,954,518 | 5/1976 | Schmit et al. ...................... | 148/1.5 X |
| 4,116,725 | 9/1978 | Shimizu ........................... | 148/1.5 X |
| 4,481,044 | 11/1984 | Schaake et al. .................... | 148/20.3 |
| 4,501,625 | 2/1985 | Tregilgas et al. ................. | 148/20.3 |
| 4,504,334 | 3/1985 | Schaake et al. ............... | 148/20.3 X |

Primary Examiner—George T. Ozaki
Attorney, Agent, or Firm—Carlton H. Hoel; Leo N. Heiting; Melvin Sharp

[57] ABSTRACT

Methods of doping $Hg_{1-x}Cd_xTe$ (50) with fast diffusing dopants by immersion in a mercury reservoir (32) doped with the desired dopants are disclosed. Also, methods of core annihilation of $Hg_{1-x}Cd_xTe$ slices or ingots by immersion in a heated mercury reservoir are disclosed. Preferred embodiments include dopants such as copper in a mercury reservoir (32) that is heated to 270° C. for a $Hg_{1-x}Cd_xTe$ slice, and a reservoir (32) that is heated to 150° C. for a thin film of $Hg_{1-x}Cd_{xn}Te$ on a CdTe substrate.

20 Claims, 2 Drawing Figures

CORE ANNIHILATION METHOD OF $HG_{1-x}CD_xTE$

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of Contract No. N00014-84-C-2337 awarded by the U.S. Navy.

BACKGROUND OF THE INVENTION

The present invention relates to semiconductor materials, and, more particularly, to the annealing and doping of mercury cadmium telluride and related materials.

Alloys of mercury telluride and cadmium telluride, generically denoted $Hg_{1-x}Cd_xTe$, are extensively employed as photosensitive semiconductors for infrared radiation. Indeed, $Hg_{.8}Cd_{.2}Te$ has a bandgap of about 0.1 eV which corresponds to a photon wavelength of 12 μm and $Hg_{0.73}Cd_{0.27}Te$ a bandgap of about 0.24 eV corresponding to a photon wavelength of 5 μm; and these two wavelengths are in the two atmospheric windows of greatest interest for infrared detectors. In particular, extrinsic p-type $Hg_{1-x}Cd_xTe$ has potential application in infrared focal plane arrays operating in the 10-12 μm wavelength window. (Intrinsic p-type $Hg_{1-x}Cd_xTe$, whose doping is presumably dominated by mercury vacancies, was recently found to have midgap recombination centers proportional in concentration to the shallow acceptors; see C. Jones et al, 3 J. Vac. Sci. Tech. A 131 (1985). These recombination centers shorten minority carrier lifetimes and are sources of recombination-generation noise; thus extrinsic p-type $Hg_{1-x}Cd_xTe$ is preferred to intrinsic p-type. p Reproducible preparation of extrinsically doped p-type $Hg_{1-x}Cd_xTe$ with carrier concentrations below about $1\times10^{15}/cm^3$ is difficult. In fact, fast diffusing acceptor dopants (or impurities) preferentially segregate to regions containing precipitated tellurium. These regions of precipitated tellurium are normally at the core (central region) of a $Hg_{1-x}Cd_xTe$ ingot or slice which arises during the usual manufacture of an ingot. The usual manufacture includes recrystallization and homogenization at a high temperature (650° C.) followed by a low temperature ($\leq$300° C.) anneal in mercury vapor for extended times to reduce the concentration of metal vacancies; this processing yields an n-type skin free of excess tellurium and a p-type core of condensed metal vacancies and precipitated tellurium. Fast diffusing residual impurities in the ingot or slice have been found to be gettered out of the skin region into the remaining core during the low temperature anneal; but when the core is annihilated by further low temperature anneal (up to several weeks duration), the impurities are released and redistribute throughout the ingot or slice and provide a p-type doping. See, H. Schaake et al, The Effect of Low Temperature Annealing on Defects, Impurities, and Electrical Properties of (Hg,Cd)Te, 3 J. Vac. Sci. Tech. A 143 (1985). Thus the slowness of the core-annihilating low temperature anneal and the stability of fast diffusing impurities (such as Group IB elements copper, silver, and gold) for doping are problems in the known methods of manufacture.

Further, methods of directly adding dopant material to a compounding ampoule containing mercury, cadmium, and tellurium only provide doping control for dopant concentrations of about $1\times10^{17}/cm^3$ and greater. U.S. Pat. No. 4,462,959 provides a method of compounding doped mercury with cadmium and tellurium which can yield doping concentrations down to $1\times10^{15}$, but these direct compounding methods are prone to impurities getting in the core and later redistributing as above described. In fact, copper diffusing through the quartz compounding ampoule apparently limits present efforts to control doping with Group IB elements; see J. Tregilgas et al, Type Conversion of (Hg,Cd)Te Induced by the Redistribution of Residual Acceptor Impurities, 3 J. Vac. Sci. Tech. A 150 (1985). Thus there are problems to control doping with fast diffusing dopants in $Hg_{1-x}Cd_xTe$ and to rapidly annihilate the core of $Hg_{1-x}Cd_xTe$.

SUMMARY OF THE INVENTION

The present invention provides methods for rapid core annihilation of an ingot or slice of $Hg_{1-x}Cd_xTe$. Rapid core annihilation is achieved by immersion of the ingot or slice in a low temperature reservoir of mercury for about one to a few days. Also, thin films of $Hg_{1-x}Cd_xTe$ or other compound semiconductors may similarly be immersion core annihilated. Preferred embodiment methods include immersion with a mercury reservoir temperature in the range of 50°-300° C.

These methods solve the problems of the known core annihilation methods by providing a rapid annihilation at low temperatures.

DESCRIPTION OF THE PREFERRED EMBODIMENTS

Figure 1:
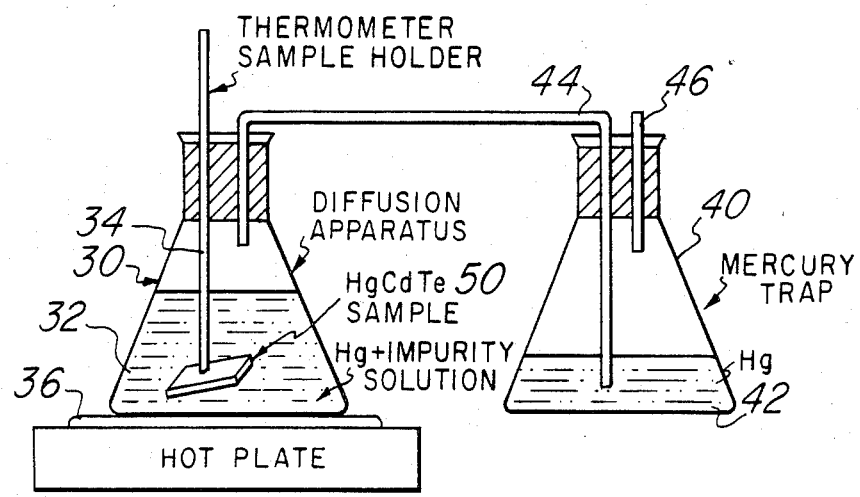
FIG. 1 is a schematic illustration of an apparatus for the use with the preferred embodiment methods.

The first preferred embodiment method of doping an ingot or slice of $Hg_{1-x}Cd_xTe$ may be performed with the apparatus schematically illustrated in FIG. 1, which includes stoppered 1,000 ml flask 30, doped mercury reservoir 32 (700 ml) in flask 30, sample support and thermometer 34, heating plate 36, stoppered 1,000 ml flask 40, mercury trap 42, connector 44, and vent 46. Slice 50 is held by sample support 34 in reservoir 32 during the doping of the slice.

The first preferred embodiment method includes the following steps for doping a 20 mm by 5 mm by 0.5 mm thick slice of $Hg_{0.78}Cd_{0.22}Te$ with copper to a carrier concentration (as calculated by Hall coefficient data at 77° K.) of $1.8\times10^{16}/cm^3$.

(a) 700 ml of pure mercury is doped with copper to a concentration of $1.8\times10^{15}$ atoms/$cm^3$ (about 50 ppb) by dissolving 135 μg of copper in the mercury (presumably the mercury has been previously analyzed for copper, silver, gold, etc. impurity levels and the amount of copper adjusted to compensate for these impurities). This doped mercury constitutes mercury reservoir 32 in FIG. 1.

(b) Mercury reservoir 32 is heated to 270° C. by heater 36, and slice 50 is immersed in heated reservoir 32 by support 34 for a period of four hours. During this immersion the fast diffusing elements in slice 50 and reservoir 32 approach equilibrium, and thus the initial copper, silver, gold, etc. levels of reservoir 32 will determine the levels in slice 50 due to the much larger mass of the reservoir. If the initial residual copper content of slice 50 exceeds that which would be produced by the doped reservoir 32, then out-diffusion of copper would occur until slice 50 reaches equilibrium with reservoir 32. Mercury vapors from heated reservoir 32 are condensed in mercury trap 42 which also keeps reservoir 32 from contact with the atmosphere and the pressure in flask 30 near one atmosphere.

(c) Reservoir 32 is cooled and slice 50 withdrawn to complete the process.

Figure 2:
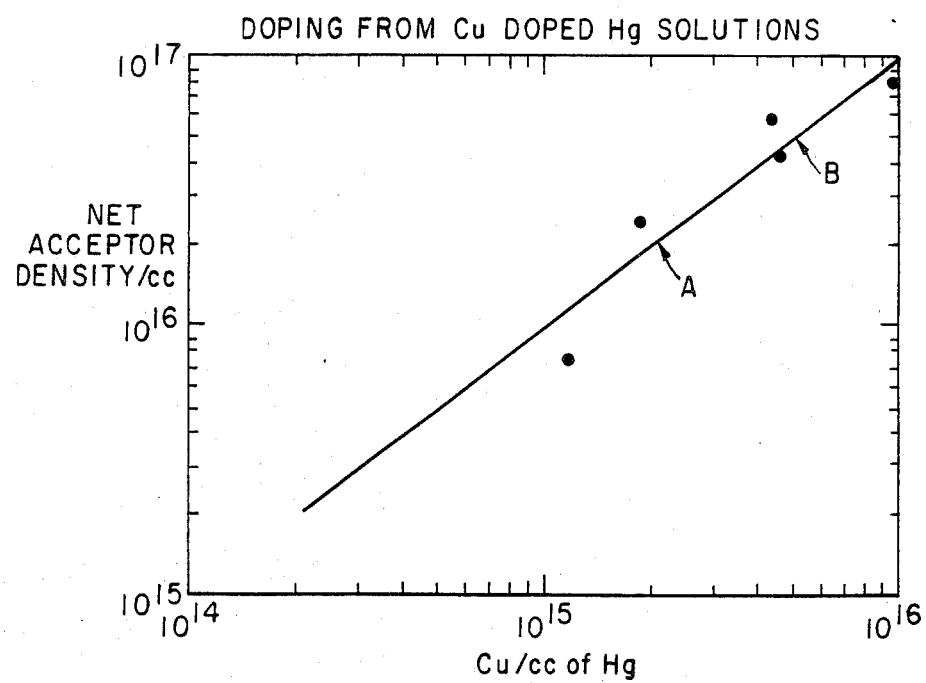
FIG. 2 illustrates the ingot carrier concentration and reservoir doping concentration correlation applicable to the first preferred embodiment method of doping.

The correlation between the initial copper concentration in reservoir 32 and the resulting concentration in slice 50 is shown in FIG. 2; the data points are experimental results and the straight line is a fit. Note that the copper concentration in slice 50 is a calculated value based on Hall coefficient data taken at 77° K. and that, in general, the equilibrium levels in the slice and reservoir differ due to differing chemical potentials. FIG. 2 is used to determine the doping of reservoir 32 required for a desired copper concentration in slice 50; and, in particular, point A on FIG. 2 corresponds to the concentrations described in the preceding paragraphs.

The second preferred embodiment method includes the following steps for doping slice 50' which is a 25 μm thick epitaxial layer of $Hg_{0.78}Cd_{0.22}Te$ on a 20 mm by 5 mm by 0.5 mm thick substrate of CdTe with copper to a carrier concentration (as calculated by Hall coefficient data at 77° K.) of $5 \times 10^{16}/cm^3$ (corresponding to point B in FIG. 2).

(a) 700 ml of pure mercury is doped with copper to a concentration of $5 \times 10^{15}$ atoms/$cm^3$ (about 125 ppb) by dissolving 370 μg of copper in the mercury (again the mercury has been previously analyzed for copper, silver, gold, etc. impurity levels and the amount of copper adjusted to compensate for these impurities). Also, about 10 g of cadmium and 500 g of tellurium are dissolved in the mercury to deter pitting of the CdTe substrate and the $Hg_{1-x}Cd_xTe$ film. This doped mercury constitutes mercury reservoir 32 in FIG. 1.

(b) Mercury reservoir 32 is heated to 150° C. by heater 36, and slice 50' is immersed in heated reservoir 32 by support 34 for a period of one day. During this immersion the fast diffusing elements in slice 50' and reservoir 32 approach equilibrium, and thus the initial copper, silver, gold, etc. levels of reservoir 32 will determine the levels in slice 50' (both the CdTe substrate and the $Hg_{1-x}Cd_xTe$ film) due to the much larger mass of reservoir 32.

(c) Slice 50' is withdrawn and allowed to cool in an saturated mercury atmosphere to complete the process.

The first preferred embodiment core annihilation method also uses the apparatus of FIG. 1 and proceeds as follows for an as-recrystallized slice 50" of $Hg_{1-x}Cd_xTe$ of size 20 mm by 5 mm by 0.5 mm. Reservoir 32 is 700 ml of pure mercury heated to 270° C. in which 10 g of cadmium and 500 g of tellurium are dissolved to deter pitting. Slice 50" is immersed in Reservoir 32 by support 34 for a period of three days. At the end of three days the core has been annihilated and slice 50" is withdrawn.

Note that a reservoir temperature of 150° C. for the core annihilation method will not lead to measureable annihilation of any of the core in three days but is expected to annihilate the core with longer immersion; whereas, a reservoir temperature of 200° to 270° C. apparently leads to core annihilation in three days for a slice of the size of slice 50". Of course, if slice 50" is withdrawn prior to complete core annihilation, then an n-type skin will have been formed around the remaining core at which various impurities will have gettered. Thus for larger slices or ingots the immersion time must be extended to annihilate the core, or the temperature can be increased, since the annihilation process appears to be interstitial mercury in-diffusing from the reservoir. However, if the core annihilation is performed at over about 300° C., the resulting concentration of metal vacancies will be unacceptably high. Also, if the core of a thin epitaxial layer of $Hg_{1-x}Cd_xTe$ on a CdTe substrate is to be annihilated, then immersion in reservoir 32 at only 50° C. is expected to rapidly annihilate the core due to the shortness of the mercury diffusion required.

The core annihilation method and the doping method may be combined by simply adding dopants to the mercury reservoir for the core annihilation. In other words, if the first preferred embodiment method of doping were applied to an as-recrystallized slice for a period of three days, then in addition to core annihilation the slice would be doped with copper to a carrier concentration of about $1.8 \times 10^{16}/cm^3$ (provided that the slice initially had no extraordinary impurity levels).

MODIFICATIONS AND ADVANTAGES

Various modifications of the preferred embodiment doping methods may be made while retaining the feature of approaching or approximating equilibration with a known doped reservoir. For example, various size slices and ingots can be immersed in various size reservoirs provided that the volume of the reservoir is much greater than that of the slice or ingot so as to insure the dominance of the initial doping levels of the reservoir. And various dopants or combinations of dopants may be used provided that they are fast diffusing such as silver, gold, lithium, sodium, etc. Slow diffusing dopants could be used, but equilibrium would only be approached slowly and problems such as dissolution of the slice or ingot in the reservoir would be aggravated.

The temperature of the reservoir can be varied, although decreasing temperatures implies longer time constants for equilibrium approach and increasing temperatures implies increased evaporation of mercury from the reservoir and increased dissolution of the slice or ingot in the reservoir. Temperature in the range of 50° C. to 300° C. should be the useful. Higher temperatures could be used, but tend to result in pitting of the $Hg_{1-x}Cd_xTe$ surface. Temperatures below 200° C. result in less pitting, but the addition of cadmium and tellurium to the mercury reservoir could be used to reduce pitting at higher temperatures.

Further, the method could also be applied to thin films of $Hg_{1-x}Cd_xTe$ such as LPE or VPE films on various substrates, as well as other compound semiconductors. Such substrates with doped films and doped bulk $Hg_{1-x}Cd_xTe$ can be incorporated in various infrared detectors and arrays to provide the photosensitive semiconductor.

Similarly, modifications of the core annihilation method may be made while retaining the feature of rapid mercury in-diffusion from a reservoir to annihilate the core. However, the core annihilation preferably employs higher reservoir temperatures and longer immersions than the doping.

The advantages of doping by equilibration include the ability to dope after manufacture of the slice or ingot and its core annihilation or after epitaxial growth of a thin film; and the doping is at low temperature. And the advantages of core annihilation by immersion include the faster annihilation at low temperatures and lower residual metal vacancy concentrations if temperatures below 220° C. are used.

What is claimed is:

1. A method of core annihilation for a $Hg_{1-x}Cd_xTe$ substrate, comprising the steps of:
    (a) providing a $Hg_{1-x}Cd_xTe$ substrate,
    (b) providing a reservoir of heated mercury, and
    (c) immersing said substrate in said heated reservoir for a period of time sufficient to annihilate the core of said substrate.

2. The method of claim 1, wherein:
    (a) said reservoir is heated to a temperature in the range of 50° C. to 300° C.

3. The method of claim 2, wherein:
    (a) said reservoir is heated to a temperature in the range of 200° C. to 270° C.

4. The method of claim 3, comprising the further step of adding cadmium and tellurium to said reservoir to reduce pitting.

5. The method of claim 2, comprising the further step of adding cadmium and tellurium to said reservoir to reduce pitting.

6. The method of claim 1, comprising the further step of:
    (a) adding cadmium and tellurium to said reservoir to reduce pitting.

7. A method of core annihilation for a $Hg_{1-x}Cd_xTe$ thin film on a substrate, comprising the steps of:
    (a) providing a substrate having a thin film of $Hg_{1-x}Cd_xTe$ thereon;
    (b) providing a reservoir of heated mercury; and
    (c) immersing said film and substrate in said heated reservoir for a time sufficient to annihilate the core of said substrate.

8. The method of claim 7, wherein:
    (a) said reservoir is heated to a temperature in the range of 50° C. to 300° C.

9. The method of claim 8, wherein:
    (a) said reservoir is heated to a temperature in the range of 200° C. to 270° C.

10. The method of claim 9, comprising the further step of adding cadmium and tellurium to said reservoir to reduce pitting.

11. The method of claim 8, comprising the further step of adding cadmium and tellurium to said reservoir to reduce pitting.

12. The method of claim 7, comprising the further step of:
    (a) adding cadmium and tellurium to said reservoir to reduce pitting.

13. A method of doping with fast diffusing dopants and annihilating the core of a $Hg_{1-x}Cd_xTe$ substrate or a $Hg_{1-x}Cd_xTe$ thin film on a substrate, comprising the steps of:
    (a) providing one of a $Hg_{1-x}Cd_xTe$ substrate and a $Hg_{1-x}Cd_xTe$ thin film on a substrate,
    (b) providing a heated reservoir of mercury doped with a fast diffusing dopant, and
    (c) immersing said $Hg_{1-x}Cd_xTe$ in said reservoir for a time sufficient to provide diffusive equilbrium between said reservoir and said $Hg_{1-x}Cd_xTe$.

14. The method of claim 13, wherein:
    (a) said reservoir is heated to a temperature in the range of 50° C. to 300° C.

15. The method of claim 14, comprising the further step of adding cadmium and tellurium to said reservoir to reduce pitting.

16. The method of claim 15 further including the step of removing from said reservoir and cooling said $Hg_{1-x}Cd_xTe$ in a saturated mercury atmosphere.

17. The method of claim 14 further including the step of removing from said reservoir and cooling said $Hg_{1-x}Cd_xTe$ in a saturated mercury atmosphere.

18. The method of claim 13, comprising the further step of:
    (a) adding cadmium and tellurium to said reservoir to reduce pitting.

19. The method of claim 18 further including the step of removing from said reservoir and cooling said $Hg_{1-x}Cd_xTe$ in a saturated mercury atmosphere.

20. The method of claim 13 further including the step of removing from said reservoir and cooling said $Hg_{1-x}Cd_xTe$ in a saturated mercury atmosphere.

* * * * *